United States Patent [19]

Fujimoto

[11] Patent Number: 4,757,520

[45] Date of Patent: * Jul. 12, 1988

[54] FM SIGNAL DEMODULATING APPARATUS

[76] Inventor: Akira Fujimoto, 971-7, Kamiochiai, Yono-shi, Saitama-ken, Japan, 338

[*] Notice: The portion of the term of this patent subsequent to Sep. 10, 2002 has been disclaimed.

[21] Appl. No.: 937,616

[22] Filed: Dec. 3, 1986

[51] Int. Cl.⁴ .......................... H03D 3/18; H03K 9/06
[52] U.S. Cl. .......................................... 375/82; 375/94; 329/50; 329/107; 329/122; 329/126
[58] Field of Search ...................... 360/44, 51; 375/25, 375/80, 82, 94; 329/50, 104, 106, 107, 110, 122, 126

[56] References Cited

U.S. PATENT DOCUMENTS

| | | | |
|---|---|---|---|
| 3,902,129 | 8/1975 | Boothroyd | 375/23 |
| 3,908,169 | 9/1975 | Tong | 375/82 |
| 3,949,313 | 4/1976 | Tamada et al. | 329/106 |
| 3,962,726 | 6/1976 | DeLand, Jr. | 360/45 |
| 4,540,947 | 9/1985 | Fujimoto | 375/82 |

Primary Examiner—Benedict V. Safourek
Assistant Examiner—Andrew J. Telesz, Jr.
Attorney, Agent, or Firm—Cushman, Darby & Cushman

[57] ABSTRACT

A FM signal demodulating apparatus with a timing pulse generator with a fixed periodic interval, a pulse deletion gate circuit whose pulse deletion ratio in a train of successive timing pulses being set in the range of 0.4 to 0.16, a edge pulse generator, a deletion delay circuit which delays edge pulses, a first counter, a second counter, a detection gate circuit, a first flip flop circuit, a second flip flop circuit and a gate circuit which receives output from the first flip flop circuit and output from the edge pulse generator, the gate circuit detecting the state in which said second counter contains all "1's" or said second counter contains all "0's".

1 Claim, 5 Drawing Sheets

FM SIGNAL DEMODULATING APPARATUS

BACKGROUND OF THE INVENTION

1. Field of the Invention

The present invention relates to an apparatus of improved performance for demodulating frequency-modulated optical communication signals and magneto-electric signals.

2. Description of the Prior Art

Of the digital data recording techniques known heretofore, NRZ (non-return-to-zero) system has been practical for a long time. In this system, however, there exist some disadvantages including a considerable variation that may occur in recording frequency depending on the pattern of data to be recorded, the necessity of a timing signal for demodulation of the data in addition to the primary data signal to be recorded, and strict requirements relative to temporal phase deviation (skew) between the data signal and the timing signal. Under such circumstances, an FM system adapted to achieve improved digital data recording is now widely applied for the purpose of eliminating the above mentioned disadvantages.

The FM system, which is a kind of self-clocking modulation, is advantageous in comparison with the foregoing NRZ system since there never arises a problem with regard to skew and so forth since the data is transmitted in the form of a composite signal obtained by mixing the data and a timing signal (which is a clock pulse) with another signal. In demodulating the FM signal, however, when any large variation exists in a bit period of the signal, it is impossible to attain accurate demodulation. In an attempt to eliminate such defects, some improvements have been previously proposed as disclosed in the U.S. Pat. Nos. 3,902,129, 3,949,313, 3,962,726 and 4,540,947.

Particularly, in a system proposed by the applicant and disclosed in said U.S. Pat. No. 4,540,947 pulse train of 64(d)($\frac{3}{3}$) with every third one of successive clock pulses from an oscillator as shown as NEG($\frac{3}{3}$), 64(d)($\frac{3}{3}$) in FIG. 1. By this means the FM signal is demodulated. However, a peak shift caused by high density of magnetic record ensure an accurate demodulation of FM signals is difficult to attain. For this reason it is required to prepare an appropriate counter-measure. As shown in FIG. 2 a signal which will cause a magnetic inversion on magnetic recording media and a read pulse thereof are shown. In the figure reference letter and numeral S-1 designates a written pulse, reference letter and numeral S-2 designates a magnetic inversion signal and reference letter and numeral S-3 designates a read pulse thereof. This read pulse is generally called an independent pulse when regenerated. A regenerated pulse signal is recorded by means of successive magnetization inversion on magnetic recording media and simulatively evaluated by means of synthesization of said independent pulse. In other words, when successive magnetization inversions are conducted a continuous regenerated pulse is obtained by means of synthesizing an independent pulse of dashed line as shown in FIG. 3 and said regenerated synthesized pulse as shown with said solid line is located with a peak different from the independent pulse. This phenomenon is called a peak shift. In the figure reference mark and letter $\Delta T$ designates a peak shift and reference letter and numeral S-4 designates a regenerated pulse. In FIG. 4 a typical example of said peak shift is shown. In the figure reference letter and numeral S-5 designates a signal of reformed pulse and reference letter and numeral S-6 designates a first flip flop output (mask signal). In FIG. 4 it is required to demodulate the FM signal as accurately as much as possible in spite of existence of a peak shift ($\Delta T$).

SUMMARY OF THE INVENTION

The object of the present invention is to provide an apparatus of improved performance surpassing the apparatus disclosed in said U.S. Pat. No. 4,540,947. To overcome said aforementioned peak shift, a method to set the pulse deletion rate within the range from 0.15 to 0.4 is disclosed in the present invention and an FM signal demodulating apparatus with an excellent efficiency is offered.

DESCRIPTION OF THE PREFERRED EMBODIMENT

An embodiment of the invention will now be described in detail with reference to the appended drawings.

To demodulate an FM signal accurately as much as possible in spite of the existence of the aforementioned peak shift it is required to satisfy a relation between the following equations (1), (2), (3) and (4) taking into consideration a written signal S-2, regenerated signal S-3, pulse corrected signal S-5 and a first flip flop output, mask signal, S-6:

$$(T+2\Delta T)a = TG1 \tag{1}$$

$$(T-2\Delta T)a = TG2 \tag{2}$$

$$TG1 < T - 2\Delta T \tag{3}$$

$$TG2 > (T+2\Delta T)/2 \tag{4}$$

In the equations TG1 and TG2 designate periods in which the first flip flop is set. In said periods edge pulse data is judged if it is already input and either data of "0" or "1" is discriminated. T designates one bit interval. Reference letter a designates the transit ratio and reference letter b designates the deletion ratio of the pulse deletion gate. There exists the relation of $a = 1 - b$ between a and b.

From the aforementioned relation the most optimum value of b of the deletion ratio against peak shift is theoretically obtained by means of a value which will make $\Delta T$ maximum. From the equations (1) and (3):

$$\Delta T < \frac{T(1-a)}{2(1+a)} \quad (5)$$

from the equations (2) and (4)

$$\Delta T < \frac{T(2a-1)}{2(1+2a)} \quad (6)$$

Figure 1:
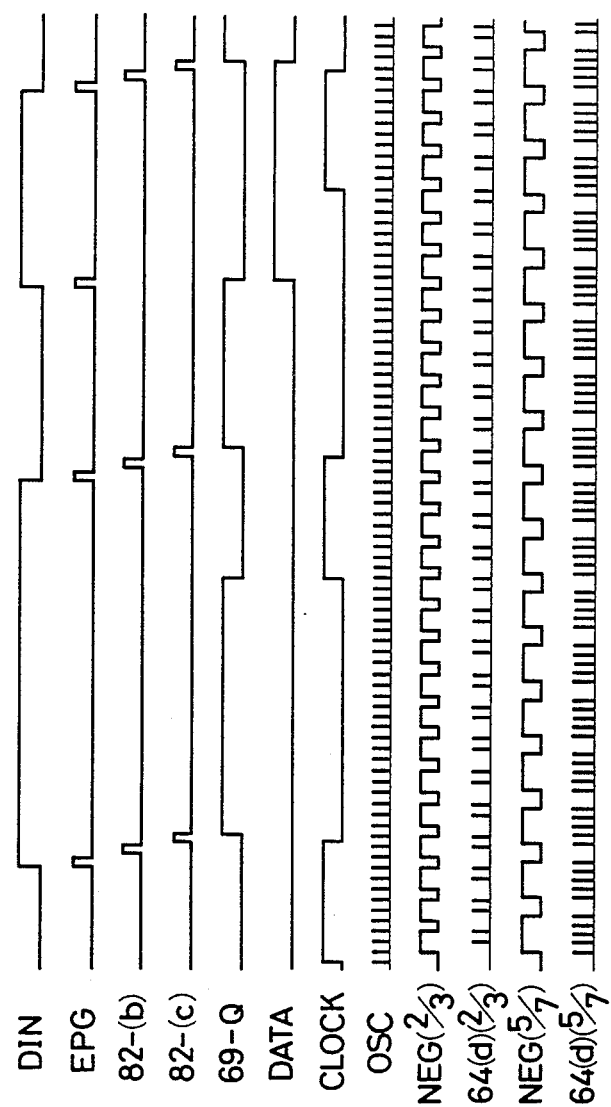
FIG. 1 is a timing chart of pulses.
Figure 2:
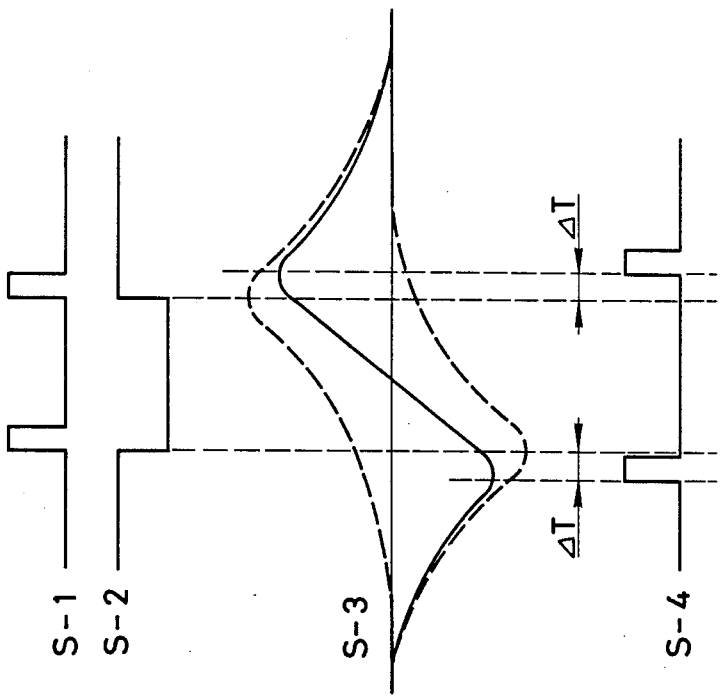
FIG. 2 is an independent pulse illustrating a peak shift.
Figure 3:
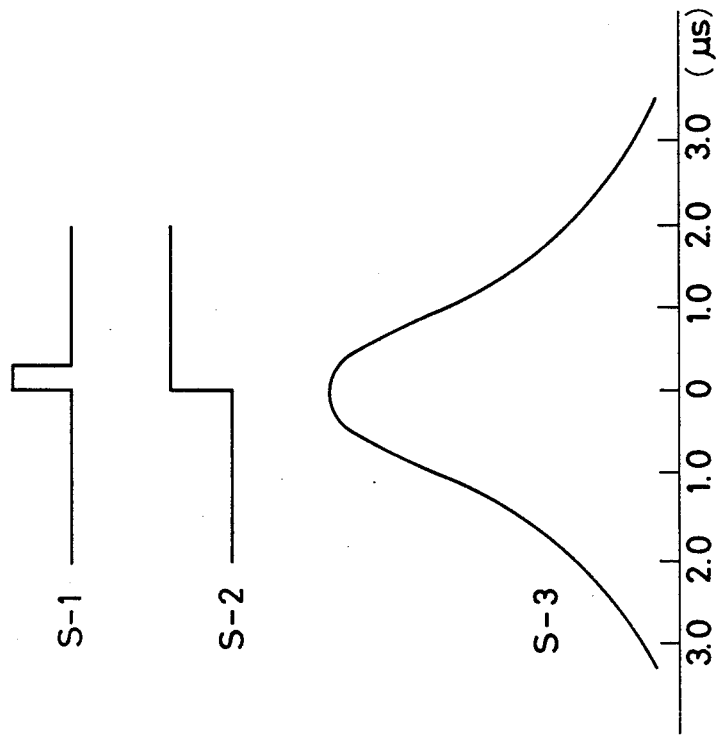
FIG. 3 is an illustrative chart of a peak shift by interference.
Figure 5:
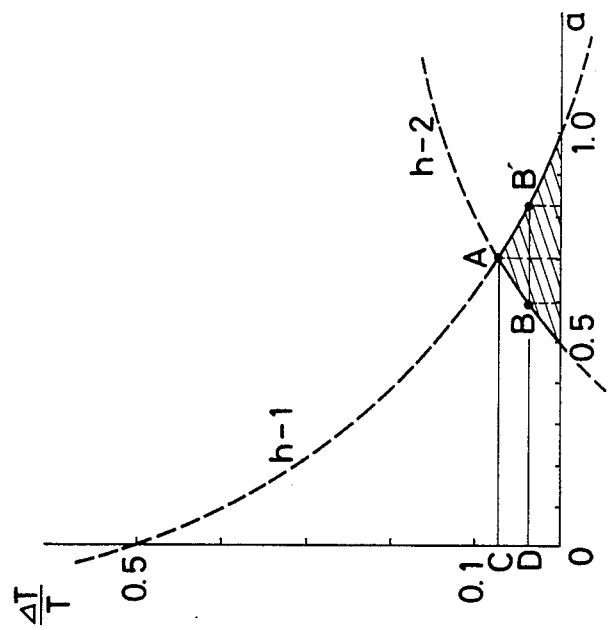
FIG. 5 is an illustrative chart showing an amount of peak shift ($\Delta T$).
Figure 4:
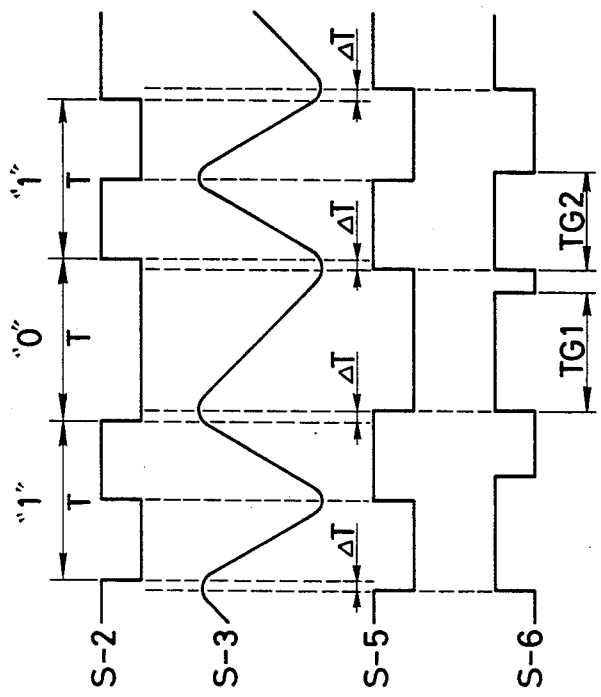
FIG. 4 is a pulse showing a peak shift in a conventional FM signal demodulating apparatus system.

The above mentioned relation between the equations (5) and (6) is illustrated with graphs in FIG. 5. In the figure reference letter and numeral h-1 represents the relation $T(1-a)/2(1+a)$ and reference letter and numeral h-2 represents the relation $T(2a-1)/2(1+2a)$. Both are hyperbolas. An intersecting point of curve h-1 and curve h-2 is designated as A and the value thereof offers the most optimum value, consequently, $$\frac{T(1-a)}{2(1+a)} = \frac{T(2a-1)}{2(1+2a)} \quad (7)$$

value a is calculated from the equation (7):
$a = \pm\sqrt{0.5} = \pm 0.707$

Accordingly, $a=0.707$ is obtained, in other words, deletion ratio is $b=1-0.707=0.293$.

In the practical design of a pulse deletion circuit, the most simple design is to compose a circuit which eliminates two pulses out of 7 pulses, thus a nearest value to $b=0.293$ is obtained. Such nearest value, being designated as b', $b'=2/7=0.286$ is obtained.

An understandable from the graphs in FIG. 5, a demodulating circuit is composed when considering a peak shift in the range of $a=0.5-1.0$, but in practical operation a signal of one bit interval in addition to peak shift changes momentarily. Thus in case a deletion ratio is set at a value of 0.5 or 0.1 on the graph in FIG. 5, it becomes very difficult to normally demodulate. Accordingly, it is desired to set the deletion ratio within 0.1 left - 0.15 right around the intersecting point A in FIG. 5 in accordance with practical experience.

For further explanation in detail, coordinates of A on the ordinate ($\Delta T/T$) is designated as C, and in accordance with calculation $C=0.0857$ is obtained. According to our practical experience it is recommended the C ordinate to be located between 0.085 and $0.0857/2=0.0429$. This ordinate of 0.0429 is designated as D. B' is the abscissa corresponding to $D=0.0429$ on the h-1 curve and thus the abscissa $a=0.84$ is obtained. Likewise B is the abscissa corresponding to $D=0.0429$ on the h-2 curve and thus the abscissa $a=0.594$ is obtained. The range between the abscissa of B and B' is desired in accordance with practical experience, namely approximately the abscissa $a=0.6-0.84$ are recommended. Accordingly, the range of the pulse deletion ratio b is recommended to be set between 0.4-0.16.

Figure 8:
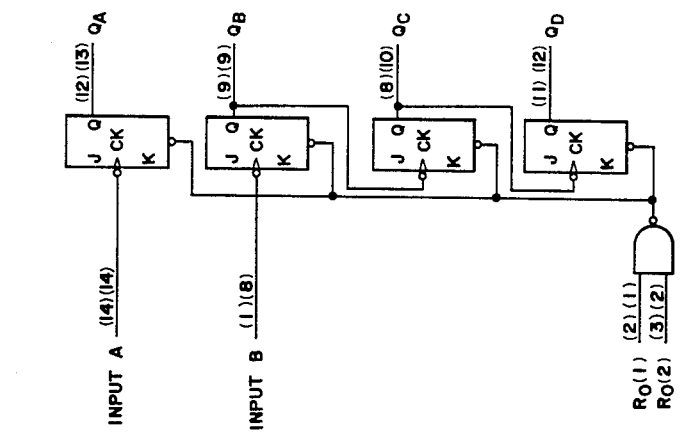
FIG. 8 shows an addition type counter available in the market.
Figure 7:
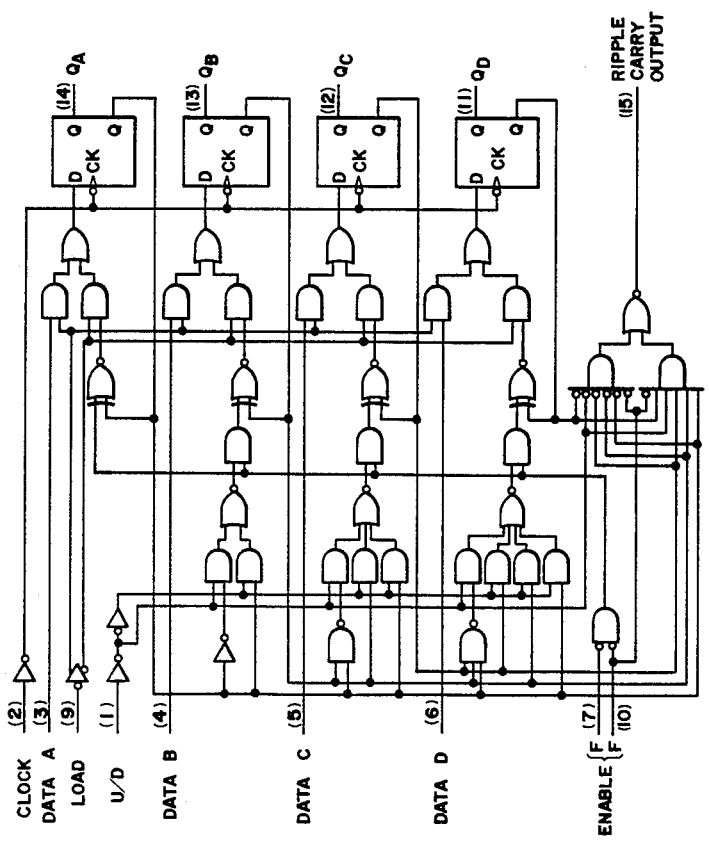
FIG. 7 shows a binary counter of reduction-and-addition type available in the market.

The applicant once proposed a simple system to delete one pulse out of three pulses under the circumstances in which bit intervals change momentarily in the U.S. Pat. No. 4,540,947 to obtain a pulse deletion ratio near an optimum value. To overcome a problem affected by peak shift the applicant now proposes a further improved system to set the deletion ratio of the most optimum pulse deletion circuit between 0.4-0.16. In the U.S.Pat. No.4,540,947 the applicant proposed a second counter working in the form of complement to the output of a first counter. The reason for this is to prepare a simple circuit in order to apply IC parts in our apparatus. Of late high density ICS have become possible and circuits of intricate composition containing ICS are manufactured. Of course a second counter of reduction type which is more complex than usual can eliminate a complement circuit and detect the whole contents of "0" in said second counter. High density ICS now became possible from both technical and economical points of view. In FIG. 7 a binary counter of reduction-and-addition type and in FIG. 8 a counter of addition type available from the Texas Instruments are shown respectively.

Figure 6:
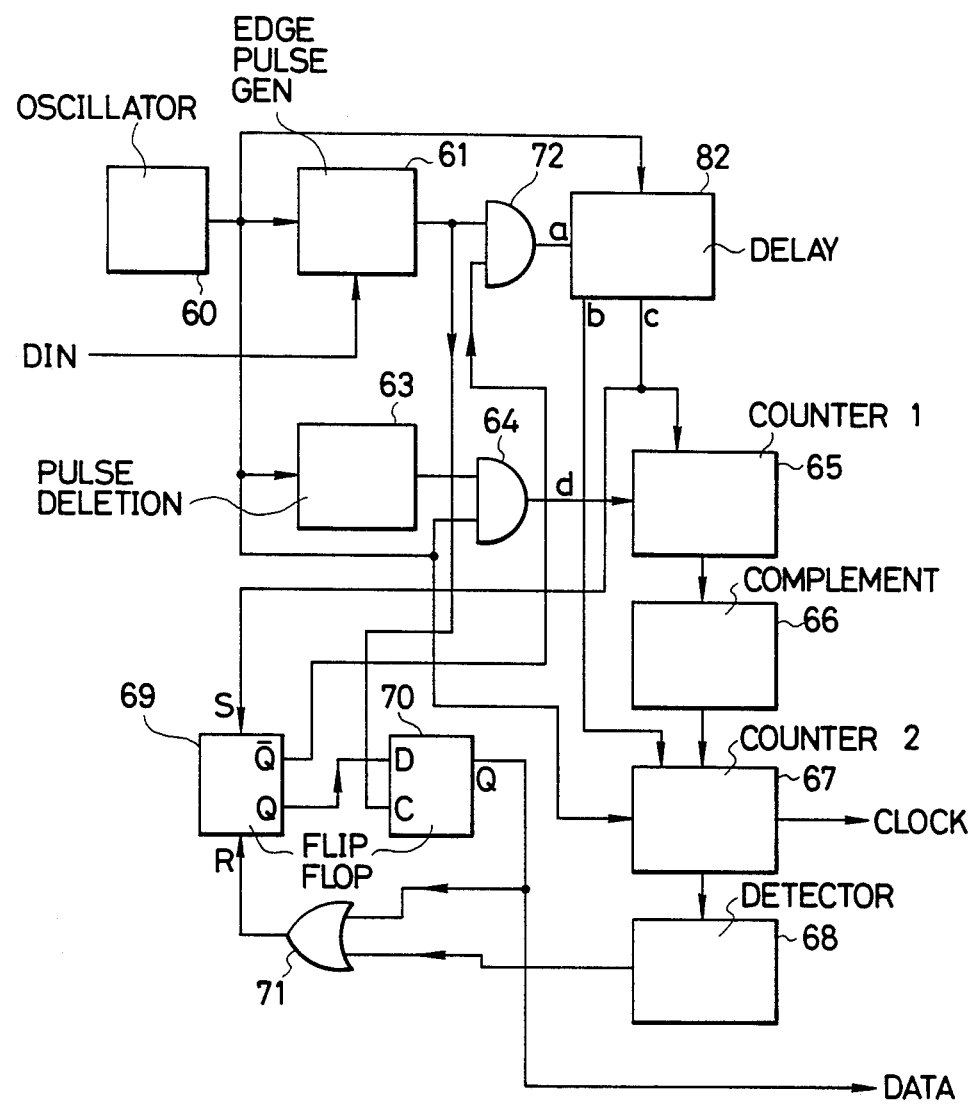
FIG. 6 is a block diagram showing an example of embodiment of FM signal demodulating of the present invention.

FIG. 6 is a block diagram of an exemplary embodiment of an apparatus of the present invention. The block diagram is quite similar to that disclosed in the U.S. Pat. No. 4,540,947. In FIG. 6 an FM signal DIN is fed to an edge pulse generator 61, which also receives the output signal from an oscillator 60 simultaneously to produce edge pulses (a) corresponding to the rise and fall of the signal DIN. The edge pulses thus obtained include data pulse and clock pulses therein and are introduced to a gate 72 from which only clock pulses are introduced to a next delay circuit 82. Then the time delay circuit 82 generates delayed signals (b) and (c). The output (c) is introduced to a first counter 65 to clear and serves to set a first flip flop 69 for defining the initiation of a mask signal and then the output (Q) of the first flip flop 69 closes the gate 72, thereby preventing it from introducing the edge pulse (a) to the delay circuit 82. In the meantime, circuits 63 and 64 constitute a pulse deletion gate to delete one out of every three output pulses from the oscillator 60, and each of the post-deletion pulses (d) is fed as a count pulse to the first counter 65. Circuit 63 is a pulse deletion circuit which deletes the above mentioned pulses, and gate 64 thus provides the post-deletion pulses (d) to the counter 65. (see FIG. 6)

The counting operation of the first counter 65 is performed during a one bit frame, and the contents thereof loaded in a second counter 67 via a complement circuit 66 by means of the output signal (b) of the delay circuit 82. The contents of the second counter 67 is then counted by the pulse output of a predetermined period obtained from the oscillator 60.

Subsequently, when a detector circuit 68 detects that the digital contents of the second counter 67 has become all "1's", and at the same time the gate 72 is opened and only the clock pulse in the output from the edge pulse generator 61 is introduced to the delay circuit, the output signal of the detector circuit 68 instantly resets the first flip flop 69 via an OR circuit 71 for defining the termination of the mask. Thus it is possible to confirm the presence or absence of the data precisely within a time equivalent to two-thirds of the unit bit interval. The second counter 67 also has a clock output which may provide the clock pulse to auxiliary equipment (not shown). When data edge pulses are produced in succession from the edge pulse generator 61 anterior to defining a next mask, the second flip flop 70 is immediately set to produce an output (Q), which serves to reset the first flip flop 69 via the OR circuit 71 for defining the initiation of a mask and to provide the data output. In this manner, even when there occurs an abrupt reduction in the bit interval, proper demodulation can be executed if the corresponding bit frame includes a pulse representative of data "1". According to the present invention, any demodulation error is so correctable that, by providing a frame of accurate data "1" during a unit bit frame within the data, the initiation of a mask is synchronized with a clock pulse at the moment of the same frame, hence ensuring proper demodulation for the subsequent data.

Thus, as described hereinabove, the FM signal demodulating apparatus of the present invention is capable of offering a variety of remarkable advantages including that a precise mask width is attainable by the use of a relatively simple circuit configuration without requiring a high frequency, so that the recent requisite of rapid FM signal demodulation can be satisfied with sufficient stability and further instant restoration is attainable from any demodulation error. The basic function as FM signal demodulating apparatus is satisfied without the second flip flop mentioned in the U.S. Pat. No. 4,540,947. In other words, the timing signal and the information signal are separated.

While the invention has been described in connection with what is presently considered to be the most practical and preferred embodiment, it is understood that the invention is not to be limited to the disclosed embodiment but, on the contrary, is intended to cover various modifications and equivalent arrangements included within the spirit and scope of the appended claims which scope is to be accorded the broadest interpretation so as to encompass all such modifications and equivalent structures.

What is claimed is:

1. Apparatus for demodulating digital FM signals, comprising:

means for generating a train of successive clock pulses;

pulse deletion means, connected to said generating means, said deletion means being set at a pulse deletion ratio within the scope of 0.4–0.16 to produce post-deletion pulses;

edge pulse generator means, adapted to receive said digital FM signals and connected to said clock pulse generating means, for generating a plurality of edge pulses in accordance with the rise and fall of said digital FM signal, said edge pulses including data edge pulses and clock edge pulses;

means for delaying each one of said clock edge pulses by a predetermined period of time to produce delayed clock edge pulses;

first counter means, connected to said delay means and to said pulse deletion means, for counting said post-deletion pulses, said counting begins synchronously with one of said delayed clock edge pulses and terminates upon the arrival of a next one of said delayed clock edge pulses;

complement means, connected to the first counter means, for forming complements of the contents of said first counter;

second counter means, connected to said clock pulse generating means and to said delay means and to said complement means, for counting by "1's" and "0's" said complements in accordance with said successive clock pulses;

detection means, connected to the second counter means, for detecting a state in which said second counter means contains all "1's";

first flip flop means, connected to said delay means for defining a beginning and a termination of a mask which synchronizes FM demodulation, said mask beginning is initiated when said flip flop means is set by one of said delayed clock edge pulses, said mask is terminated when said first flip flop means is reset in accordance with an output of said detection means;

second flip flop means, connected to said first flip flop means and to said edge pulse generator means and to said detector means, for providing the demodulated digital output and for generating output data pulses synchronously with one of said data edge pulses obtained when said first flip flop means is set and when said detector means detects all "1's": and gate means, connected to said first flip flop means and to said edge pulse generator means and to said delay means for providing only the edge pulses corresponding to clock edge pulses to said delay means.

* * * * *